(12) United States Patent
Jung

(10) Patent No.: US 7,645,705 B2
(45) Date of Patent: Jan. 12, 2010

(54) METHOD OF FABRICATING A SEMICONDUCTOR DEVICE HAVING A PRE METAL DIELECTRIC LINER

(75) Inventor: Sung Kyung Jung, Incheon (KR)

(73) Assignee: Dongbu HiTek Co., Ltd., Seoul (KR)

( * ) Notice: Subject to any disclaimer, the term of this patent is extended or adjusted under 35 U.S.C. 154(b) by 391 days.

(21) Appl. No.: 11/615,750

(22) Filed: Dec. 22, 2006

(65) Prior Publication Data

US 2007/0155111 A1 Jul. 5, 2007

(30) Foreign Application Priority Data

Dec. 29, 2005 (KR) .................. 10-2005-0134173

(51) Int. Cl.
*H01L 21/302* (2006.01)
(52) U.S. Cl. .............. 438/706; 438/710; 438/714; 438/9; 438/700

(58) Field of Classification Search ............... 438/261, 438/287–288, 591–593, 769–777, 689–757, 438/8–9
See application file for complete search history.

(56) References Cited

U.S. PATENT DOCUMENTS

| | | | | |
|---|---|---|---|---|
| 5,312,775 A | * | 5/1994 | Fujii et al. | .......... 438/625 |
| 7,253,046 B2 | * | 8/2007 | Higashi et al. | ........ 438/216 |

FOREIGN PATENT DOCUMENTS

| | | |
|---|---|---|
| JP | 08-017926 | 1/1996 |
| JP | 2000-216377 | 8/2000 |

* cited by examiner

*Primary Examiner*—Dung A. Le
(74) *Attorney, Agent, or Firm*—Sherr & Vaughn, PLLC

(57) ABSTRACT

A method of fabricating a semiconductor device including forming a pre metal dielectric liner over a semiconductor substrate on which a transistor is formed. The pre metal dielectric liner is sputter etched to form an unstable interface at the surface. The boron is trapped in an interface in an unstable state in a surface of the PMD liner to effectively suppress the boron penetration phenomenon to the semiconductor substrate.

7 Claims, 5 Drawing Sheets

METHOD OF FABRICATING A SEMICONDUCTOR DEVICE HAVING A PRE METAL DIELECTRIC LINER

The present application claims priority under 35 U.S.C. 119 and 35 U.S.C. 365 to Korean Patent Application No. 10-2005-0134173 (filed on Dec. 29, 2005), which is hereby incorporated by reference in its entirety.

BACKGROUND

In general, when forming a Complementary Metal Oxide Semiconductor (CMOS) in which an n channel type MOS transistor and a p channel MOS transistor are integrated on the same substrate, gate patterns and a silicide are formed. Then, to fill a space between the gate patterns, an insulating layer is formed using a Boron Phospho Silicate Glass (BPSG) oxide layer, having excellent flowability.

To suppress the diffusion of boron B in the BPSG oxide layer into a substrate during a subsequent thermal process, a pre metal dielectric (PMD) liner is formed prior to a deposition of the BPSG oxide layer.

FIG. 1 is a cross-sectional view showing a semiconductor device having a general pre metal dielectric liner.

With reference to FIG. 1, a device isolation layer 102 defines an active region of a semiconductor substrate 100 having first region A and second region B.

An n-channel type transistor is arranged in the first region A of the semiconductor device 100, and a p-channel type transistor is arranged in the second region B of the semiconductor device 100.

Further, a nitride layer 110 is arranged over an entire surface of the substrate as the PMD liner, and the BPSG oxide layer 120 is formed over the nitride layer 110.

The nitride layer 110 serves as an etch stop layer during a subsequent etching for a contact. Simultaneously, nitride layer 110 functions to suppress the diffusion of boron B in the BPSG oxide layer 120 into the semiconductor substrate 100 during a subsequent thermal treatment. When an impurity ion such as the boron B penetrates the semiconductor substrate 100, the threshold voltage of a device is locally changed, which degrades the stability of the device. In the related art, in order to suppress the penetration of the boron B to the highest degree, a gas atmosphere is controlled to increase the bonding strength of nitrogen-hydrogen N—H during the formation of the nitride layer 110. However, using only the method according to the related art, the suppression of boron B penetration into the semiconductor substrate 100 is limited. Moreover, it requires a thick nitride layer 110 as the PMD liner.

SUMMARY

Accordingly, embodiments relate to a method of fabricating a semiconductor device having a pre metal dielectric liner that substantially obviates one or more problems due to limitations and disadvantages of the related art.

Embodiments relate to a method of fabricating a semiconductor device having a pre metal dielectric liner, which may improve the reliability of a device by suppressing a penetration of boron in a BPSG used as an insulating layer into a semiconductor substrate to the highest degree.

Additional advantages, objects, and features of the embodiments will be set forth in part in the description which follows and in part will become apparent to those having ordinary skill in the art upon examination of the following or may be learned from practical experience with the embodiments. The objectives and other advantages of the embodiments may be realized and attained by the structure particularly pointed out in the written description and claims hereof as well as the appended drawings.

To achieve these objects and other advantages and in accordance with the purpose of the embodiments, there is provided a method of fabricating a semiconductor device including forming a pre metal dielectric liner over a semiconductor substrate on which a transistor is formed. The pre metal dielectric liner is sputter etched to form an unstable interface at the surface.

A BPSG oxide layer may be formed over the pre metal dielectric liner. The pre metal dielectric liner may be formed of a nitride layer. The sputtering-etching for the pre metal dielectric liner may be performed using argon ions.

It is to be understood that both the foregoing general description and the following detailed description of the embodiments are exemplary and explanatory and are intended to provide further explanation of the claims.

BRIEF DESCRIPTION OF THE DRAWINGS

Example

DETAILED DESCRIPTION

Figure 1:
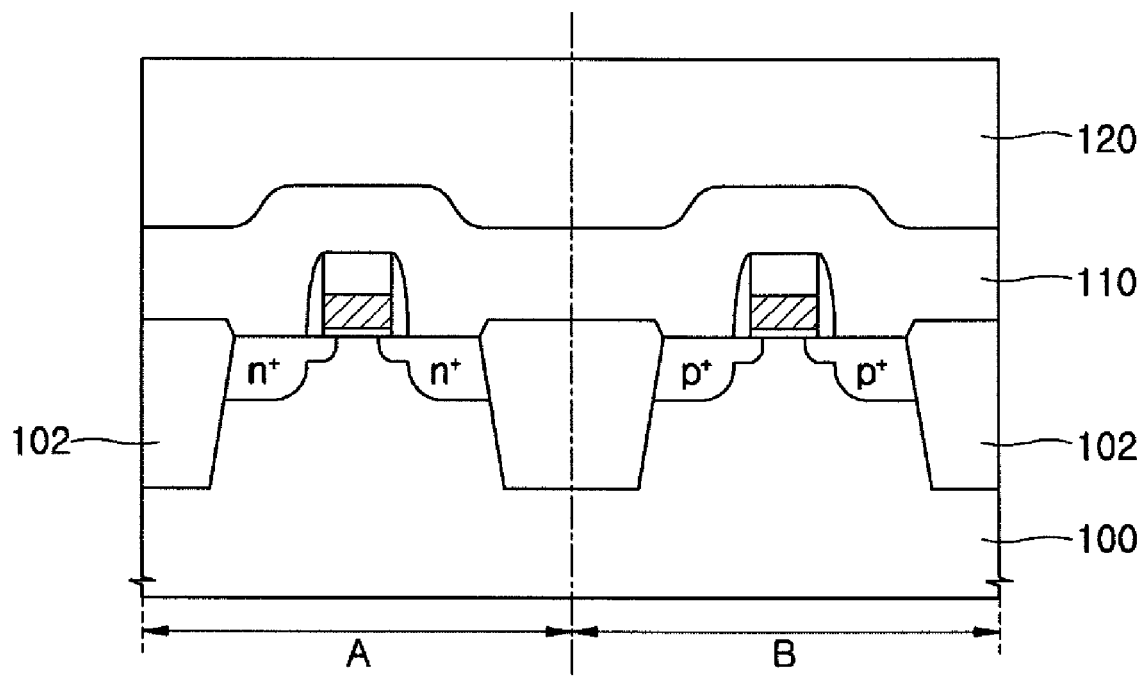
FIG. 1 is a cross-sectional view showing a semiconductor device having a pre metal dielectric liner.
Figure 2:
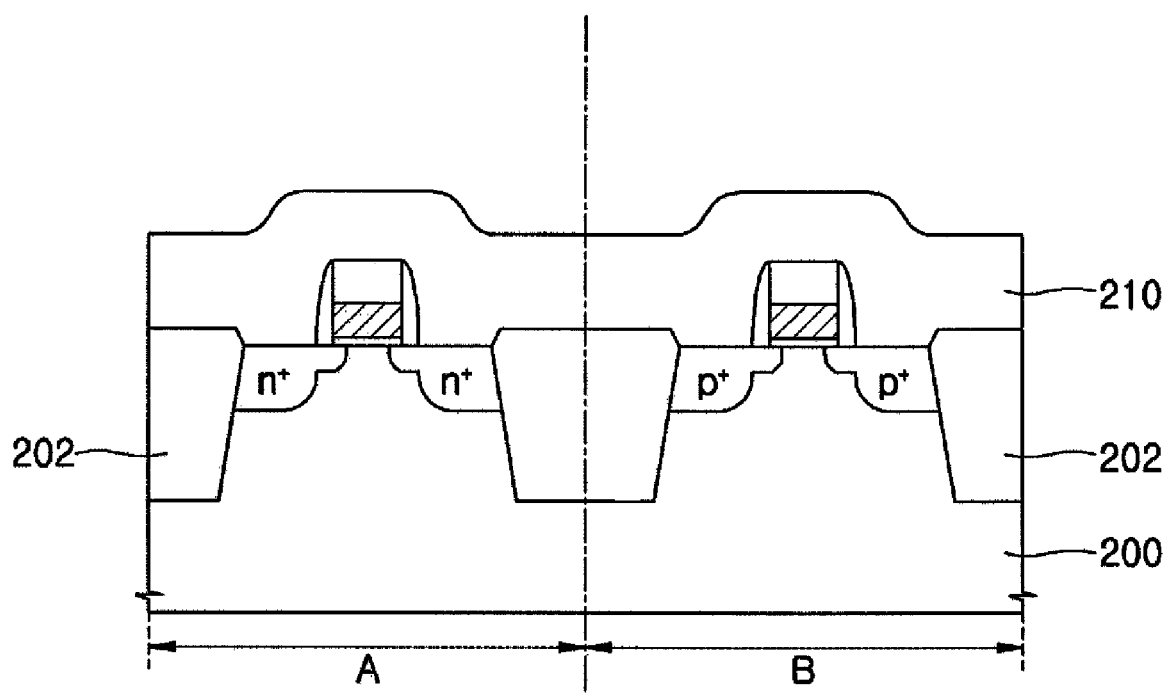
FIGS. 2 to 4 are a cross-sectional view showing a method for manufacturing a semiconductor device having a pre metal dielectric liner according to embodiments.
Figure 3:
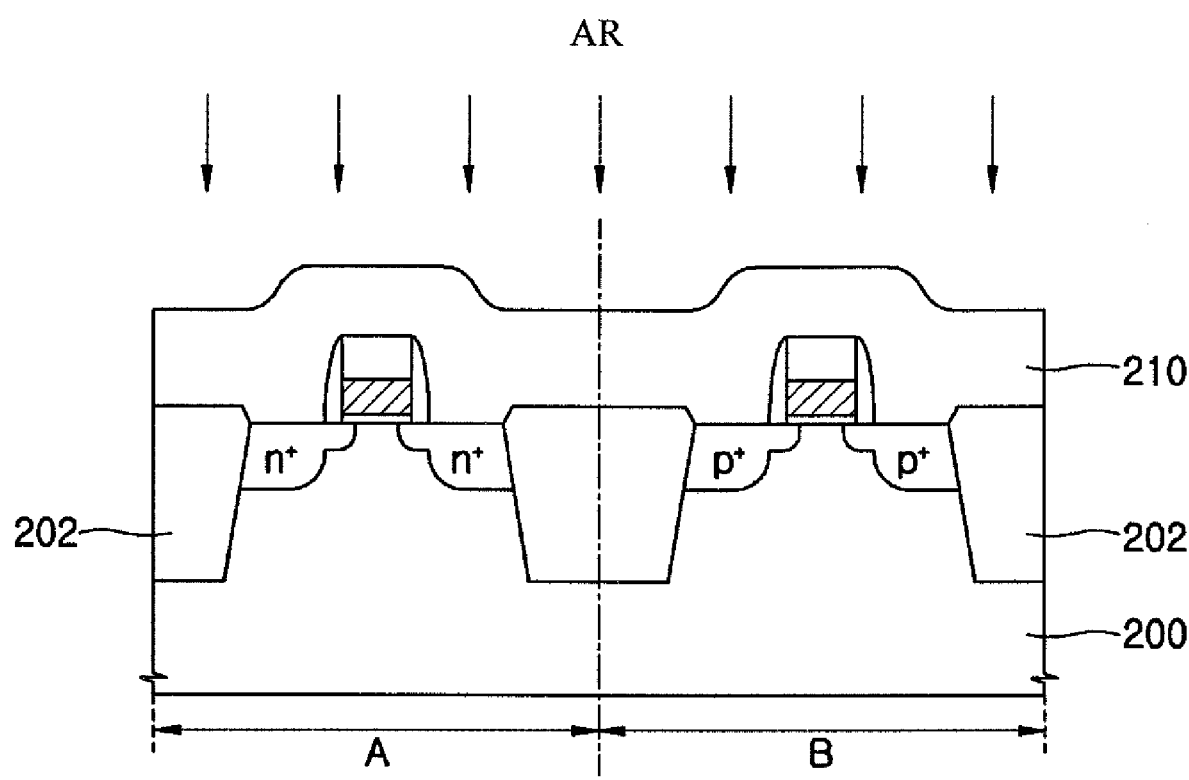
Figure 4:
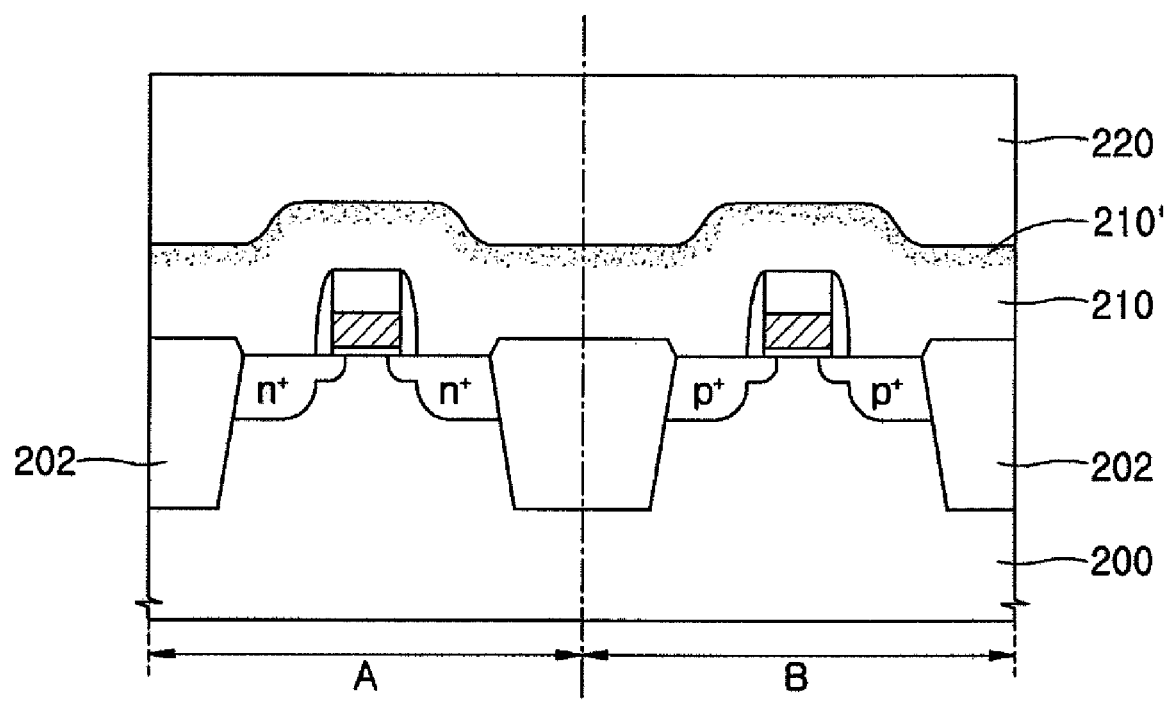

FIGS. 2 to 4 are a cross-sectional view showing a method for manufacturing a semiconductor device having a pre metal dielectric liner according to embodiments.

First, referring to FIG. 2, a device isolation layer 202 is formed in semiconductor substrate 200 having a first region A and a second region B to define an active region. Although the device isolation layer 202 is a trench device isolation layer, embodiments are not limited thereto. Next, an n-channel type MOS transistor and a p channel type MOS transistor are formed in the first region A and the second region B to constitute a complementary MOS (CMOS) transistor. In the embodiment, the embodiment has been described that the CMOS transistor is formed on the semiconductor substrate 200. However, the CMOS transistor is integrated in the semiconductor substrate 200 together with an active device and a passive device. Otherwise, one of the active device and the passive device can be integrated in the semiconductor substrate 200.

N$^+$ type source/drain regions are formed in the first region A of the semiconductor substrate 200 in which an n-channel type MOS transistor is formed, and a gate insulating layer is interposed above a channel region therebetween to support a gate conductive layer. A metal silicide layer is arranged over the gate conductive layer. A gate spacer layer is arranged over the sides of the gate conductive layer and the metal silicide layer. Although not shown in the drawings, a metal silicide layer can be arranged over upper portions of the source/drain regions. P$^+$ type source/drain regions are arranged in the second region B of the semiconductor substrate 200 in which the p-channel type MOS transistor is formed, and a gate insulating layer is interposed above a channel region therebetween to support a gate conductive layer. A metal silicide layer is arranged over the gate conductive layer. A gate spacer layer is arranged over the sides of the gate conductive layer and the metal silicide layer. Although not shown in the drawings, a metal silicide layer can be arranged over upper portions of the source/drain regions. As described above, after the n-channel type MOS transistor and the p-channel type MOS transistor have been formed, a nitride layer 210 is formed over an entire surface thereof as a pre metal dielectric liner.

With reference to FIG. 3, as illustrated in the drawing by arrows, an argon sputtering etching process is performed over the surface of the nitride layer 210. In the sputtering etching process, an argon ion collides with the nitride layer 210 surface to form an interface 210' (of FIG. 4) in an unstable energy state. To change the unstable state to a stable state, the interface 210' (of FIG. 4) has an affinity for impurities and ions. It functions as a trap with respect to penetrating ions.

With reference to FIG. 4, after argon sputtering etching has formed an interface 210' with an unstable energy state at the surface, a BPSG oxide layer 220 is formed over the nitride layer 210.

Figure 5:
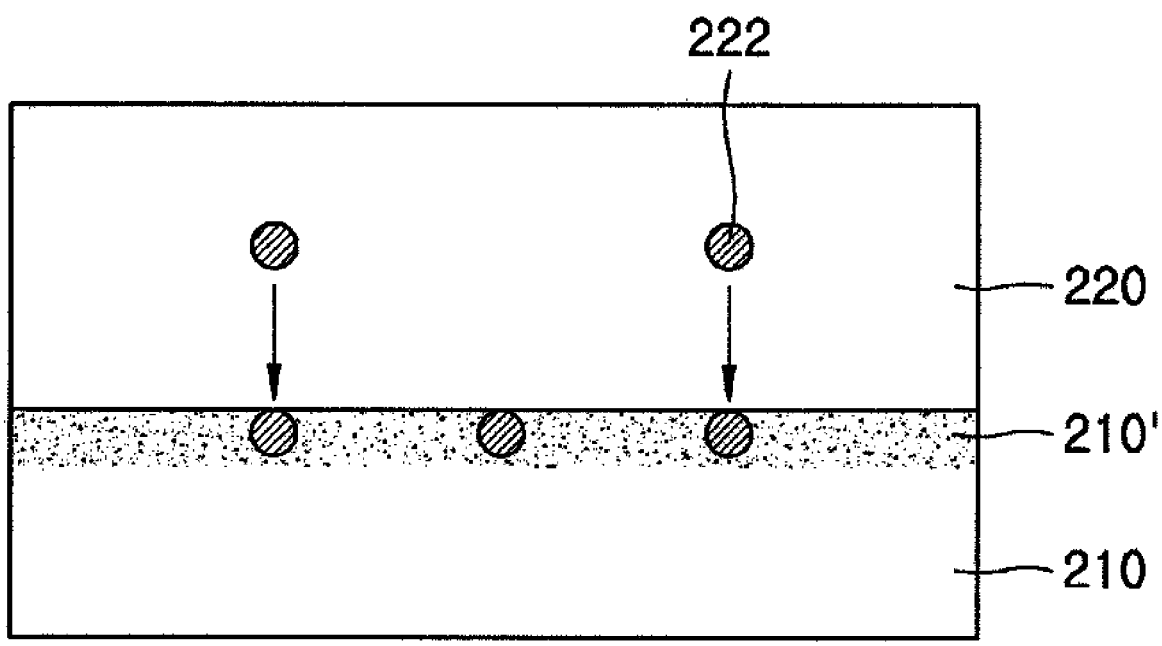
FIG. 5 is a view for illustrating a boron diffusion suppression effect of a semiconductor device having a pre metal dielectric liner formed by the method according to embodiments.

FIG. 5 is a view for illustrating a boron permeation suppression effect of a semiconductor device having a pre metal dielectric liner formed by the method according to embodiments.

With reference to FIG. 5, the interface 210' having an unstable energy state at the surface is present on the surface of a nitride layer 210, and a BPSG oxide layer 220 is formed over the nitride layer 210.

When a subsequent thermal treatment is carried out, boron B ions 222 in the BPSG oxide layer 220 become exited and move towards the semiconductor substrate. The interface 210' present at a surface of the nitride layer 210 traps the boron B ions 222 before they penetrate the semiconductor substrate. The trapped ions change an unstable state to a stable state. Accordingly, the boron B ions are trapped in the interface 210' of the nitride layer 210 and the penetrating phenomenon is suppressed.

As is understood from the forgoing description, in a method of fabricating a semiconductor device having a pre metal dielectric liner, after the PMD has formed an interface at the surface of the PMD liner, the sputtering etching process is performed. Accordingly, the boron B is trapped in an interface in an unstable state in a surface of the PMD liner to effectively suppress the boron penetration phenomenon in the semiconductor substrate.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. A method of fabricating a semiconductor device comprising:
   forming a pre metal dielectric liner over an entire surface of a semiconductor substrate on which a transistor is formed;
   sputtering-etching the pre metal dielectric liner to form an unstable interface at a surface thereof; and
   forming a BPSG oxide layer over the pre metal dielectric liner.

2. The method according to claim 1, wherein the pre metal dielectric liner is formed of a nitride layer.

3. The method according to claim 1, wherein, the sputtering-etching for the pre metal dielectric liner is performed using argon ions.

4. The method of claim 1, wherein the unstable interface is formed all top side of the pre metal dielectric liner.

5. A method of fabricating a semiconductor device comprising:
   forming a pre metal dielectric liner over an entire surface of a semiconductor substrate on which a transistor is formed;
   sputtering-etching the pre metal dielectric liner to form an unstable interface at a surface thereof; and
   forming a BPSG oxide layer over the sputtering-etched pre metal dielectric liner.

6. The method according to claim 5, wherein a sputtering-etching for the pre metal dielectric liner uses argon ions.

7. The method of claim 5, wherein the unstable interface is formed all top side of the pre metal dielectric liner.

* * * * *